US010830876B2

(12) United States Patent
Otsuka et al.

(10) Patent No.: US 10,830,876 B2
(45) Date of Patent: Nov. 10, 2020

(54) DISTANCE-MEASURING DEVICE AND METHOD THEREOF (71) Applicant: SAMSUNG ELECTRONICS CO., LTD., Suwon-si (KR)

(72) Inventors: Tatsuhiro Otsuka, Suwon-si (KR); Jungwoo Kim, Hwaseong-si (KR); Heesun Yoon, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 382 days.

(21) Appl. No.: 15/812,492

(22) Filed: Nov. 14, 2017

(65) Prior Publication Data

US 2018/0372848 A1 Dec. 27, 2018

(30) Foreign Application Priority Data

Jun. 23, 2017 (KR) .................. 10-2017-0079951

(51) Int. Cl.
G01S 7/48 (2006.01)
G01S 7/4861 (2020.01)
G01S 17/10 (2020.01)
H03G 7/08 (2006.01)
G01S 7/4865 (2020.01)
H03G 11/02 (2006.01)
G01J 1/44 (2006.01)

(52) U.S. Cl.
CPC ............... *G01S 7/4861* (2013.01); *G01J 1/44* (2013.01); *G01S 7/4865* (2013.01); *G01S 17/10* (2013.01); *H03G 7/08* (2013.01); *H03G 11/02* (2013.01); *G01J 2001/4433* (2013.01); *G01J 2001/4466* (2013.01)

(58) Field of Classification Search
CPC ........... G01S 7/487; G01S 17/93; G01S 7/486
See application file for complete search history.

(56) References Cited

U.S. PATENT DOCUMENTS

| 5,565,870 A | 10/1996 | Fukuhara et al. |
| 5,777,507 A | 7/1998 | Kaminishi et al. |
| 2015/0338865 A1 | 11/2015 | Ciubotaru |
| 2017/0097263 A1 | 4/2017 | Williams |
| 2018/0284229 A1* | 10/2018 | Liu ................ G01S 7/4865 |

FOREIGN PATENT DOCUMENTS

| JP | 2967656 B2 | 10/1999 | |
| JP | 2000346941 | * 12/2000 | ............ G01S 17/10 |
| JP | 2000346941 A | 12/2000 | |

(Continued)

OTHER PUBLICATIONS

Thomas L. Floyd, "Basic Operational Amplifier Circuits", (2012) Electronic Devices, 9th edition Pearson Education (Year: 2012).*

(Continued)

*Primary Examiner* — Luke D Ratcliffe
(74) *Attorney, Agent, or Firm* — Sughrue Mion, PLLC (57) ABSTRACT

Provided are a distance-measuring device and a method thereof. The distance-measuring device detects light reflected by an object and converts the light into electrical signals, outputs a saturation signal equal to or greater than a reference value from among the electrical signals, detects a peak using the saturation signal, and measures a distance to the object using the peak.

19 Claims, 10 Drawing Sheets (56) References Cited

FOREIGN PATENT DOCUMENTS

| JP | 2016-205884 A | 12/2016 |
|---|---|---|
| WO | 9113319 A1 | 9/1991 |
| WO | 9953425 A1 | 10/1999 |

OTHER PUBLICATIONS

Communication dated Jul. 18, 2018, issued by the European Patent Office in counterpart European Application No. 17210355.8.
Anonymous, "Log Amplifier", Apr. 11, 2017, 3 pages total, XP055490474, Retrieved on Jul. 5, 2018 from https://en.wikipedia.org/w/index.php?title=Log_amplifier&oldid=774867641.

* cited by examiner

DISTANCE-MEASURING DEVICE AND METHOD THEREOF

CROSS-REFERENCE TO RELATED APPLICATION

This application claims priority from Korean Patent Application No. 10-2017-0079951, filed on Jun. 23, 2017, in the Korean Intellectual Property Office, the disclosure of which is incorporated herein in its entirety by reference.

BACKGROUND

1. Field

Apparatuses and methods consistent with exemplary embodiments relate to a device and method of measuring the distance of an object.

2. Description of the Related Art

Recently, technologies, related 3D cameras and to Light Detection And Ranging (LIDAR) systems, for obtaining information on the distance to objects, have been studied. One of these technologies is a time-of-flight (TOF) technique for measuring the distance between a photographing apparatus and an object (hereinafter referred to as a depth image).

The TOF technique performs a process of projecting light having a specific wavelength, for example, a near-infrared wavelength (850 nm), to an object using a light-emitting diode (LED) or a laser diode (LD); using a photodiode D or a camera to measure or photograph light having the same wavelength reflected off the object; and extracting a depth image. Various TOF techniques are being developed for optical processing processes, such as light projection, object reflection, light modulation, photographing, and processing. Discussions on how to accurately measure a distance to an object are also ongoing.

SUMMARY

One or more exemplary embodiments may provide a distance-measuring device capable of more accurately measuring a distance using light and a method thereof.

Additional exemplary aspects and advantages will be set forth in part in the description which follows and, in part, will be apparent from the description, or may be learned by practice of the presented exemplary embodiments.

According to an aspect of an exemplary embodiment, a distance-measuring device includes: an optical receiver configured to detect light reflected by an object and convert the light into electrical signals; a saturation circuit configured to output a saturation signal equal to or greater than a reference value from among the electrical signals; a peak detector configured to detect a peak using the saturation signal output from the saturation circuit; and a processor configured to measure a distance to the object using the peak.

The saturation circuit may output, as the saturation signal, a variable signal whose magnitude varies according to magnitudes of the electrical signals when the electrical signals are less than the reference value, and may output, as the saturation signal, a signal of constant magnitude when the electrical signals are equal to or greater than the reference value.

The saturation circuit may include an operational amplifier, and at least one diode connected in parallel to the operational amplifier.

An inverted input terminal of the operational amplifier may be connected to a first end of the diode, and an output terminal of the operational amplifier may be connected to a second end of the diode.

The saturation circuit may further include a resistor, where a first end of the resistor is connected to the optical receiver and a second end of the resistor is connected to the inverted input terminal of the operational amplifier and to the first end of the diode.

The distance-measuring device may further include a capacitor disposed between the optical receiver and the saturation circuit and connected in series with the resistor.

The reference value may be equal to magnitude of a forward voltage of the diode.

The diode may include a Zener diode.

The saturation circuit may output an electrical signal equal to or greater than a first reference value from among the electrical signals as a first saturation signal, and may output an electrical signal less than a second reference value from among the electrical signals as a second saturation signal.

The first reference value may be a forward voltage of the Zener diode, and the second reference value may be a Zener voltage of the Zener diode.

The diode may include a first diode connected in parallel to the operational amplifier, and a second diode connected in parallel to the operational amplifier and to the first diode and having a polarity opposite to that of the first diode.

The magnitude of the saturation signal may be equal to the magnitude of the reference value.

Magnitude of the reference value may be 1 V or less.

The optical receiver may include a photodetector configured to output a current corresponding to the received light; and a current-to-voltage converter configured to convert the current into a voltage and output the voltage as the electrical signals.

The photodetector may include a Single-Photon Avalanche Diode (SPAD) or an Avalanche Photodiode (APD).

The peak detector may detect a peak using a Constant Fraction Discriminator (CFD) method.

The peak detector may further include a comparator configured to compare an input signal with a reference value and output the input signal as a pulse signal.

The distance-measuring device may further include a light source configured to irradiate the object with light in the form of a laser pulse.

According to an aspect of another exemplary embodiment, a method of measuring a distance includes: detecting light reflected by an object and converting the light into electrical signals; outputting a saturation signal which is an electrical signal equal to or greater than a reference value from among the electrical signals; detecting a peak using the saturation signal; and measuring a distance to the object using the peak.

The outputting of the saturation signal may include outputting a variable signal whose magnitude varies according to magnitudes of the electrical signals when the electrical signals are less than the reference value, and outputting the saturation signal of constant magnitude when the electrical signals are equal to or greater than the reference value.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Reference will now be made in detail to exemplary embodiments, which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects.

Figure 1:
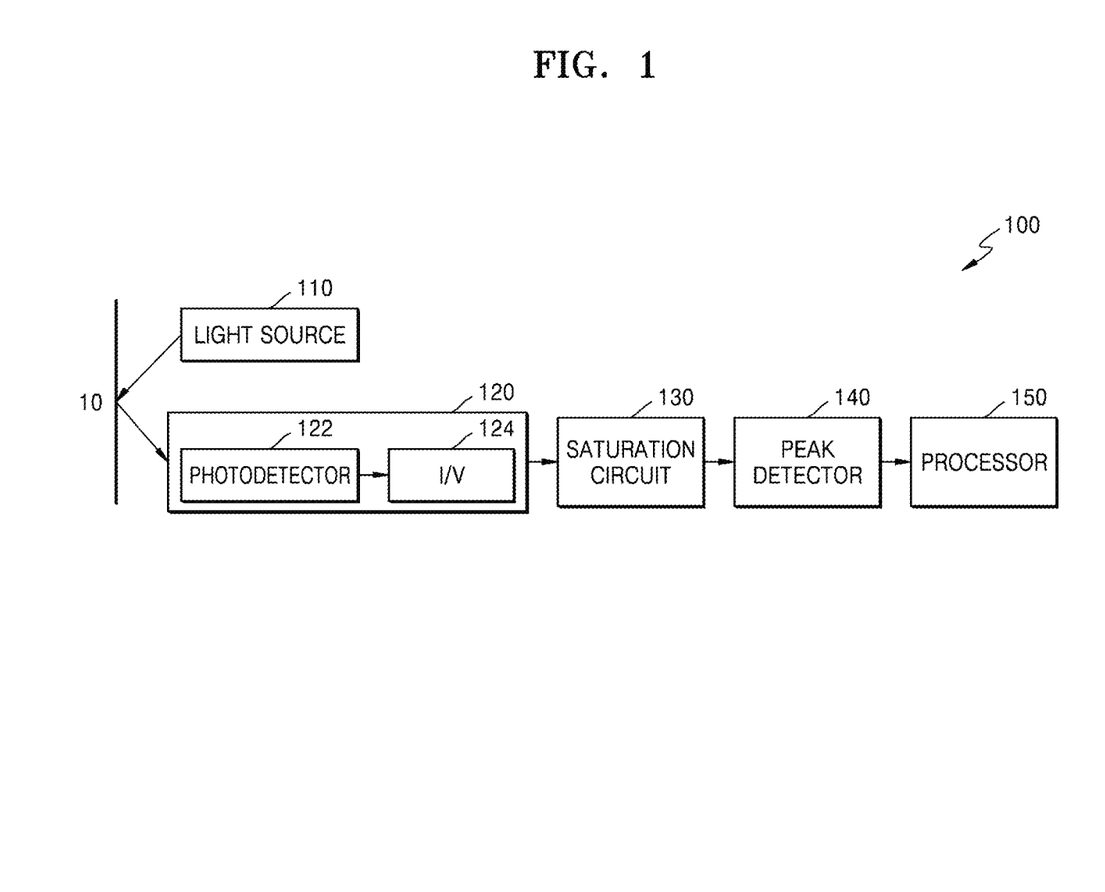
FIG. 1 is a block diagram of a distance-measuring device according to an exemplary embodiment.

Hereinafter, a distance-measuring device and method thereof according to various exemplary embodiments will be described with reference to the accompanying drawings. FIG. 1 is a block diagram of a distance-measuring device 100 according to an exemplary embodiment. Referring to FIG. 1, the distance-measuring device 100 may include a light source 110 for emitting light onto an object 10, an optical receiver 120 for detecting light reflected by the object and for converting the light into an electrical signal, a saturation circuit 130 for outputting a signal, equal to or greater than a reference value among electrical signals, as a saturation signal, a peak detector 140 for detecting a peak from the signal output from the saturation circuit 130, and a processor 150 for measuring a distance to the object using the detected peak.

The light source 110 may be any device that emits light. For example, the light source 110 may emit infrared light. However, as well as emitting infrared light, the light source 110 may emit light of other wavelengths. In this case, a correction for removing information about mixed natural light may be used. For example, the light source 110 may be a laser light source. However, this is merely exemplary. The light source 110 may be any one of an edge-emitting laser, a vertical-cavity surface-emitting laser (VCSEL), and a distributed feedback laser. For example, the light source 110 may be a laser diode. The light source 110 need not be implemented as a single housing with the optical receiver 120, a saturation circuit 130, a peak detector 140, and processor 150, according to an exemplary embodiment. The light source may comprise a plurality of light sources.

The optical receiver 120 may convert light reflected or scattered by an object 10 into an electrical signal, for example, a voltage. The optical receiver 120 may include a photodetector 122 for outputting an electrical signal corresponding to light, for example, a current, and a current-to-voltage conversion circuit 124 for converting the current output from the photodetector 122 into a voltage. In addition, the optical receiver 120 may further include a lens or the like for condensing the light reflected by the object 10.

The photodetector 122 may be a light-receiving element. The photodetector 122 may be a light-receiving element operating in a state in which a bias voltage is applied. For example, the photodetector 122 may include an Avalanche Photo Diode (APD) or a Single Photon Avalanche Diode (SPAD). Circuit configurations of the optical receiver 120 may vary depending on whether an APD or a SPAD is included in the optical receiver 120. For example, a circuit configuration may be an analog front end (AFE) or a time digital counter (TDC). As the specific circuit configurations are commonly known to those of ordinary skilled in the art, detailed descriptions thereof will not be given herein.

The saturation circuit 130 may output, as a saturation signal, a signal equal to or greater than a reference value among electrical signals input from the optical receiver 120. For example, if the input electrical signals are less than the reference value, the saturation circuit 130 may output a variable signal whose magnitude varies according to magnitudes of the input electrical signals. If the input electrical signals are greater than the reference value, the saturation circuit 130 may output a saturation signal of constant magnitude. An absolute value of the saturation signal may be the same as the reference value, and the codes may be opposite to each other. The magnitude of the reference value may be about 1 V or less.

Figure 2:
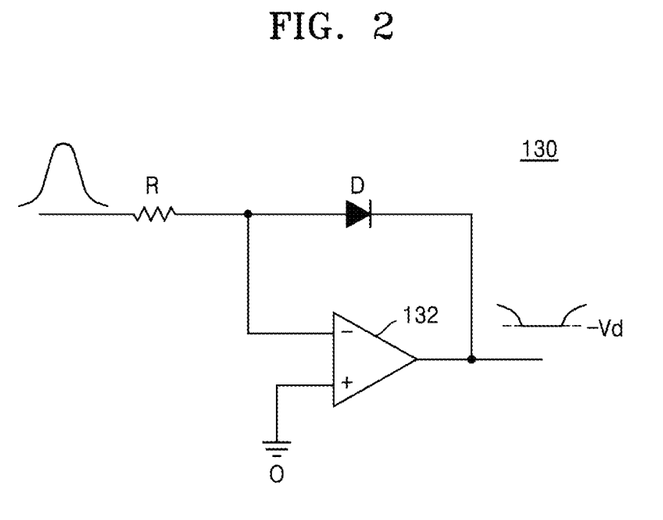
FIG. 2 is a view of a saturation circuit according to an exemplary embodiment.

FIG. 2 is a view of a saturation circuit 130 according to an exemplary embodiment. Referring to FIG. 2, the saturation circuit 130 may include an operational amplifier 132 and a diode D connected in parallel to the operational amplifier 132. The diode D may be a diode D based on a PN junction. For example, the diode D may include a PN diode, a Zener diode, or the like.

Input terminals of the operational amplifier 132 may include an inverted input terminal (−) and a non-inverted input terminal (+). The inverted input terminal (−) of the operational amplifier 132 may be connected to an output terminal of the optical receiver 120 and to the non-inverted input terminal (+) of the operational amplifier 132 may be grounded. An output terminal of the operational amplifier 132 may be connected to an input terminal of the peak detector 140. One end of the diode D may be connected to the output terminal of the optical receiver 120 and to the inverted input terminal (−) of the operational amplifier 132. The other end of the diode D (a switch device) may be connected to the output terminal of the operational amplifier 132 and to the input terminal of the peak detector 140.

The saturation circuit 130 may further include a resistor R connected at one end to the optical receiver 120 and at the other end to the inverted input terminal (−) of the operational amplifier 132 and one end of the diode D. A resistance of the resistor R may be determined by magnitude of a saturation signal to be output.

If an electrical signal input to the saturation circuit 130 is less than a reference value, the saturation circuit 130 may output a variable signal whose magnitude varies according to the magnitude of the input electrical signal. The magnitude of the variable signal is determined by the input electrical signal, the resistor R, and an internal resistance of the diode D. In more detail, the magnitude of the variable signal may be proportional to magnitude of the input electrical signal and the internal resistance of the diode D, and may be inversely proportional to the resistance of the resistor R. In addition, since the operational amplifier 132 operates as an inverting amplifier 132, codes of the input electrical signal and the variable signal may be opposite to each other.

If an electrical signal input to the saturation circuit 130 is equal to or greater than a reference value, the saturation circuit 130 may output a saturation signal having a constant magnitude, for example, a voltage of constant magnitude by a forward voltage drop regardless of the magnitude of the input electrical signal. Here, the reference value may be a forward voltage Vd of the diode D. An absolute value of the saturation signal may be the same as the reference value, and the codes may be opposite to each other.

The peak detector 140 may detect a peak in the electrical signal applied from the saturation circuit 130. The peak detector 140 may detect the peak by detecting a rising edge and a falling edge of the electrical signal. The peak detector 140 may divide a signal output from the saturation circuit 130, that is, a signal obtained by combining a variable signal and a saturation signal, into a plurality of signals, and may detect a peak using a Constant Fraction Discriminator (CFD) method for detecting a zero cross point by inverting and time delaying some signals and combining them with remaining signals. A circuit using the CFD method may be a CFD circuit. The peak detector 140 may further include a comparator, and may output the detected peak as a pulse signal. Alternatively, the peak detector 140 may include only a comparator which outputs, as a high level signal, the saturation signal output from the saturation circuit 130.

The processor 150 may measure a distance to an object 10 using the peak detected by the peak detector 140. For example, the processor 150 may measure a distance to an object using a detection time of the peak detected by the peak detector 140 and an emission time of light emitted from the light source 110. Methods of measuring a distance using a peak are commonly known to those of ordinary skilled in the art, and therefore, detailed descriptions thereof will not be given herein.

The optical receiver 120 may receive light of various intensities according to the intensity of light emitted from the light source 110, a distance to an object, reflectance of the object, and the like. Thus, the optical receiver 120 may output electrical signals of various magnitudes.

Figure 3:
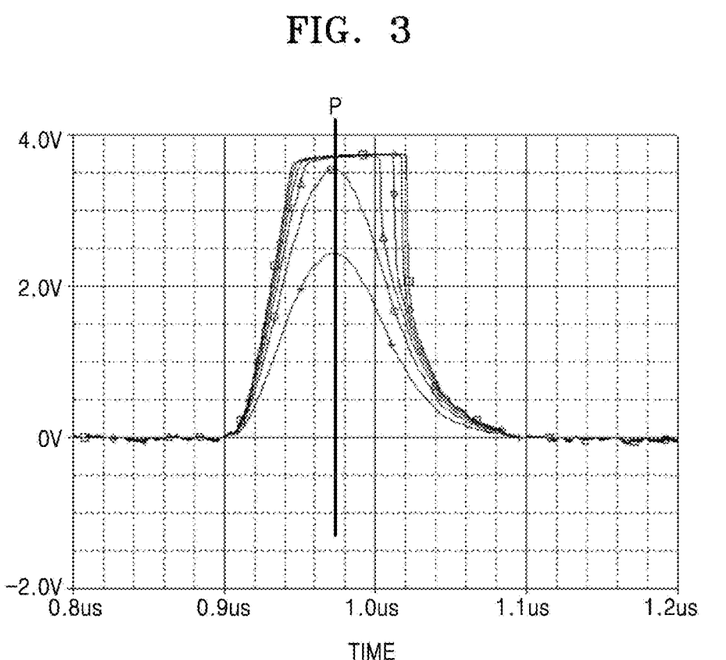
FIG. 3 is a reference view of signals output from an optical receiver.
Figure 4:
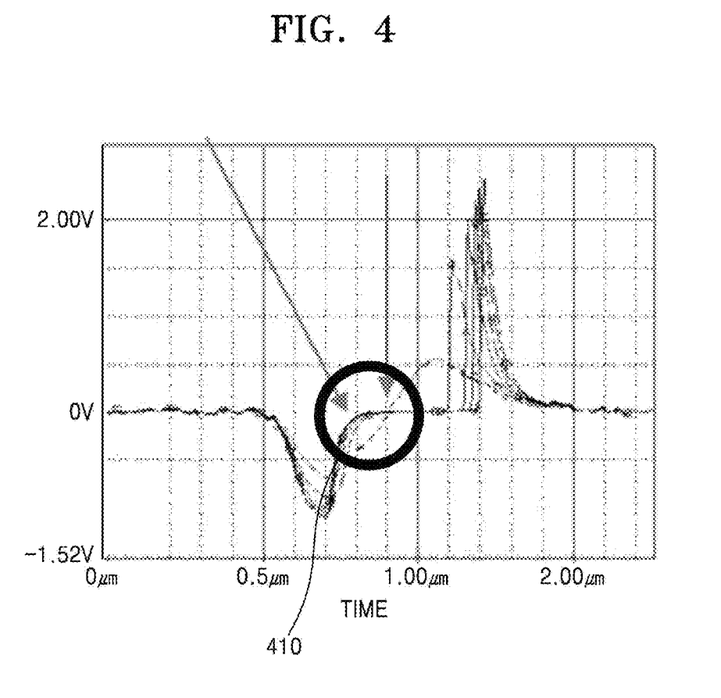
FIG. 4 is a reference view of a result of a Constant Fraction Discriminator (CFD) circuit receiving and outputting the signals of FIG. 3.

FIG. 3 is a reference view of signals output from an optical receiver, and FIG. 4 is a reference view of a result of a CFD circuit receiving and outputting the signals of FIG. 3. As shown in FIG. 3, magnitudes of electrical signals output from the optical receiver 120 may vary. Accordingly, magnitudes of peaks of the electrical signals may vary. It can be seen that a deviation of the electrical signals with respect to the peak P becomes larger as the distance becomes closer to the peak P. It can also be seen that falling curves of the electrical signals are more deviated than rising curves of the electrical signals. Nevertheless, it can be seen that peak points of the electrical signals are almost equal.

The CFD circuit outputs the result shown in FIG. 4 when the electrical signals of FIG. 3, that is, the electrical signals having a large deviation toward the peak are input. The CFD circuit divides an input signal into a plurality of signals, and detects a peak using a CFD method for detecting a zero cross point by inverting and time delaying some signals and combining them with remaining signals. However, when the electrical signals having a large deviation toward the peak are input, it can be seen that a range 410 of points passing through an O-shaped circle is increased as shown in FIG. 4. This causes an error in peak detection. That is, even if actual peak points are almost equal, accurate peak detection may be difficult as magnitudes of the electrical signals vary.

Meanwhile, as shown in FIG. 3, it can be seen that the deviation of the electrical signals decreases as the distance from the peak P increases. Therefore, when the peak is detected using electrical signals having less deviation, an error of peak detection may be reduced. The saturation circuit 130 according to an exemplary embodiment may output an electrical signal equal to or greater than a reference value as a saturation signal so that electrical signals having magnitude close to zero may be used.

Figure 5:
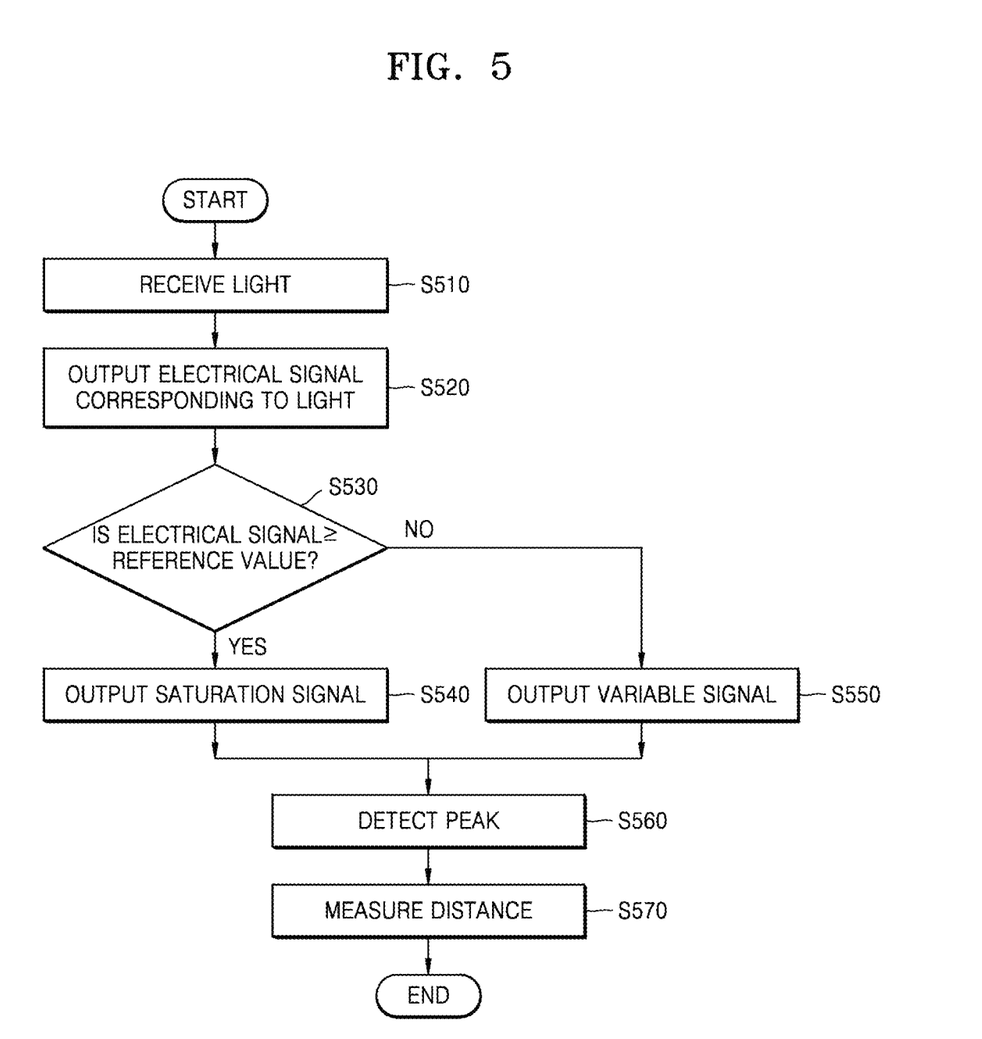
FIG. 5 is a flowchart of a method of operating a distance-measuring device according to an exemplary embodiment.

FIG. 5 is a flowchart of a method of operating the distance-measuring device 100 according to an exemplary embodiment. Referring to FIG. 5, in operation S510, the optical receiver 120 receives light reflected by an object. The light source 110 may emit light to the object at predetermined time intervals. The light source 110 may emit a laser pulse waveform at predetermined time intervals. The light emitted from the light source 110 is reflected by the object, and at least some of the reflected light may be received by the optical receiver 120. The light source 110 may be any one of an edge-emitting laser, a vertical-cavity surface-emitting laser (VCSEL), and a distributed feedback laser. For example, the light source 110 may be a laser diode.

In operation S520, the optical receiver 120 converts light reflected or scattered by the object into an electrical signal, for example, a voltage. The light reflected by the object may be condensed by a lens, and the photodetector 122 may output a current corresponding to the condensed light. Then, the current-to-voltage conversion circuit 124 may convert the current into a voltage and output the voltage. The photodetector 122 is a light-receiving element and may operate in a state in which a bias voltage is applied. However, the present disclosure is not limited thereto. For example, the photodetector 122 may include an APD or a SPAD.

In operation S530, the saturation circuit 130 compares magnitude of the electrical signal input from the optical receiver 120 with a reference value. If the input electrical signal is equal to or greater than the reference value (YES in operation S530), in operation S540, a saturation signal of constant magnitude is output regardless of magnitude of the input electrical signal.

Alternatively, if the input electrical signal is less than the reference value (NO in operation S530), in operation S550, a variable signal whose magnitude varies according to magnitude of the input electrical signal is output. The reference value may have magnitude of a forward voltage of the diode D included in the saturation circuit 130, and may be about 1 V or less. An absolute value of the saturation signal may be the same as the reference value, and the codes may be opposite to each other.

The saturation circuit 130 may include the operational amplifier 132 and the diode D connected in parallel to the operational amplifier 132. The diode D may include a PN junction. For example, the diode D may include a PN diode, a Zener diode, or the like. Input terminals of the operational amplifier 132 may include an inverted input terminal (−) and a non-inverted input terminal (+). The inverted input terminal (−) of the operational amplifier 132 may be connected to an output terminal of the optical receiver 120 and to the non-inverted input terminal (+) of the operational amplifier 132 may be grounded. An output terminal of the operational amplifier 132 may be connected to an input terminal of the peak detector 140. One end of the diode D may be connected to the output terminal of the optical receiver 120 and to the inverted input terminal (−) of the operational amplifier 132. The other end of the diode D (a switch device) may be connected to the output terminal of the operational amplifier 132 and to the input terminal of the peak detector 140.

The saturation circuit 130 may further include the resistor R connected at one end to the optical receiver 120 and at the other end to the inverted input terminal (−) of the operational amplifier 132 and to one end of the diode D. The magnitude of the resistor R may be determined by magnitude of a saturation signal to be output.

In operation S560, the peak detector 140 may detect a peak from a signal that is received from the saturation circuit 130. The peak detector 140 may detect the peak by detecting a rising edge and a falling edge of the signal that is received from the saturation circuit 130, that is, a signal in which the variable signal and the saturation signal are combined. Alternatively, the saturation circuit 130 may divide the signal that is received from the saturation circuit 130 into a plurality of signals, and may detect a peak using a CFD method for detecting a zero cross point, by inverting and time delaying some signals and combining them with the remaining signals. A circuit using the CFD method may be a CFD circuit. The peak detector 140 may further include a comparator, and may output the detected peak as a pulse signal. Alternatively, the peak detector 140 may include only a comparator which outputs the saturation signal as a high-level signal.

In operation S570, the processor 150 may measure a distance to an object using a peak detection time. For example, the processor 150 may measure a distance to an object using a time difference between the peak detection and light emission from the light source 110. As such a method of measuring a distance using a peak is commonly known to those of ordinary skilled in the art, detailed descriptions thereof will not be given herein.

Figure 6:
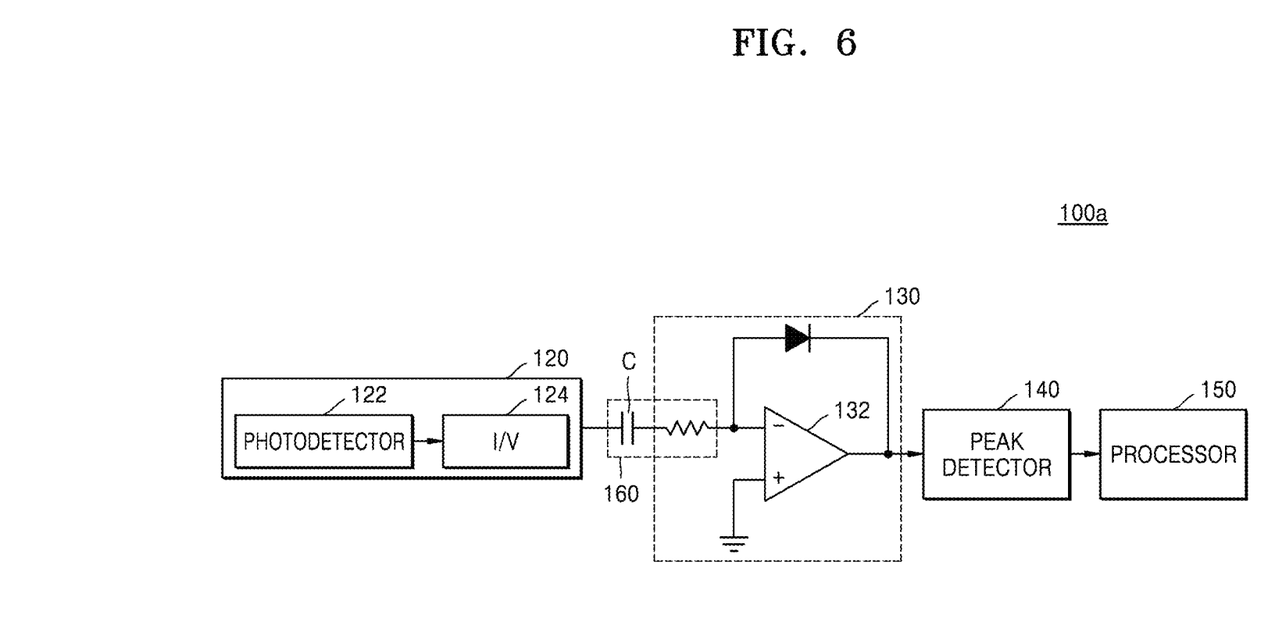
FIG. 6 is a view of a distance-measuring device according to another exemplary embodiment.

FIG. 6 is a view of the distance-measuring device 100a according to another exemplary embodiment. Referring to FIGS. 1 and 6, the distance-measuring device 100a of FIG. 6 may include a capacitor C connected in series between the optical receiver 120 and the saturation circuit 130. That is, one end of the capacitor C may be connected to the optical receiver 120 and the other end may be connected to the saturation circuit 130, for example, to the resistor R of the saturation circuit 130. The capacitor C and the resistor R shown in FIG. 6 may together form a high-pass filter 160. Thus, by transmitting only an electrical signal having a frequency higher than a specific frequency, from among electrical signals output from the optical receiver 120, any noise from the other electrical signals may be removed. Also, the capacitor C shown in FIG. 6 makes a curve of electrical signals more gradual. Thus, the deviation of signals input to the saturation circuit 130 may be reduced.

Figure 7:
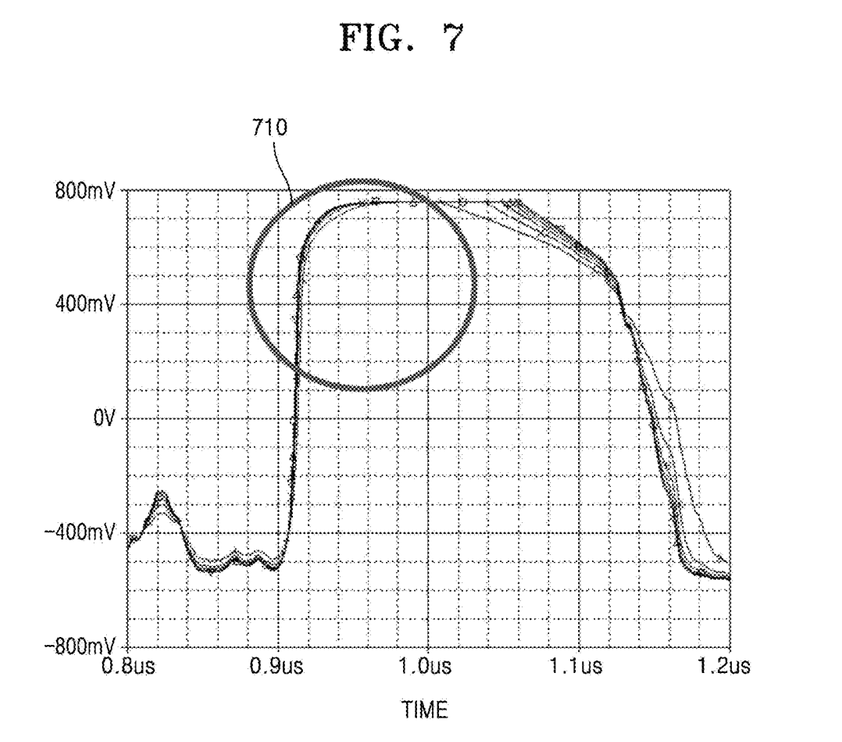
FIG. 7 is a reference view of signals output from a saturation circuit according to an exemplary embodiment.

FIG. 7 is a reference view of signals output from the saturation circuit 130 according to an exemplary embodiment. The waveform of FIG. 7 is a result of the signals shown in FIG. 3 passing through the saturation circuit 130 after passing through the high-pass filter 160. It can be seen that saturation circuit 130 outputs an electrical signal equal to or greater than a reference value, from among input electrical signals, as a saturation signal of constant magnitude, and outputs an electrical signal less than a reference value as a variable signal whose magnitude varies. It can be seen that a rising edge 710 of the electrical signal shown in FIG. 7 is a start point of the reference value. In addition, since the deviation of signals output from the saturation circuit 130 is small, any error in the peak detection may be reduced.

Figure 8:
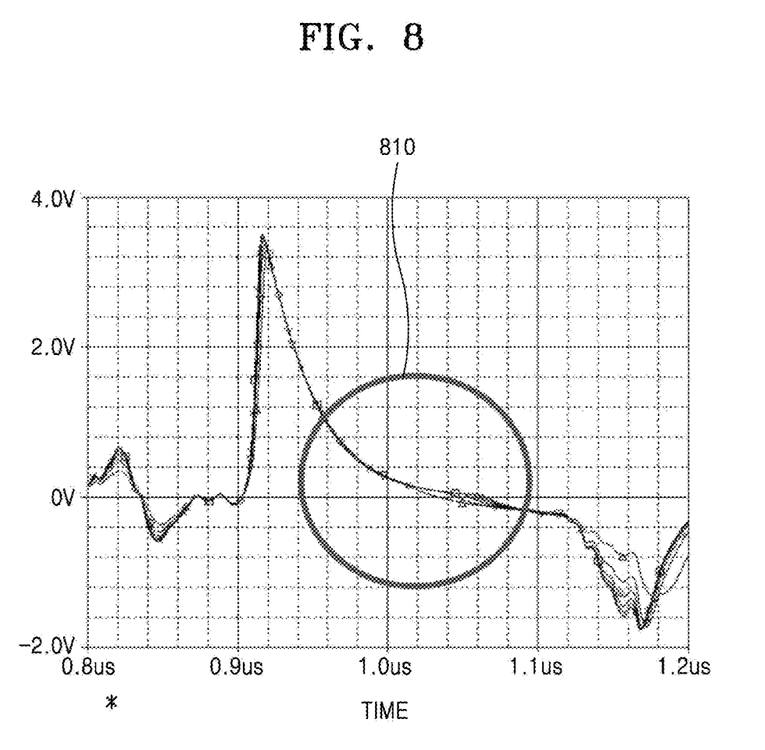
FIG. 8 is a reference view of signals output from a CFD circuit, which is a type of peak detector, according to an exemplary embodiment.

FIG. 8 is a reference view of signals output from a CFD circuit, which may function as the peak detector 140, according to an exemplary embodiment. The electrical signals of FIG. 7 are input to the CFD circuit, and the output signals are as shown in FIG. 8. Since a signal having small deviation is input, from among a plurality of signals, it can be seen that a range 810 of points passing through an O-shaped circle is much smaller than that of FIG. 4.

Figure 9:
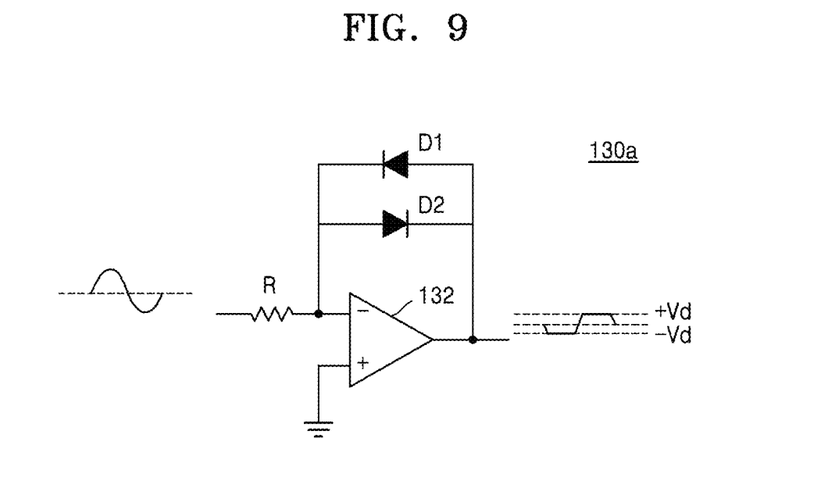
FIG. 9 is a view of a saturation circuit according to exemplary example embodiment.

FIG. 9 is a view of a saturation circuit 130a according to another exemplary embodiment. Referring to FIGS. 2 and 9, the saturation circuit 130a of FIG. 9 may include a plurality of diodes D1 and D2. For example, the saturation circuit 130a of FIG. 9 may include a first diode D1 connected in parallel to the operational amplifier 132 and a second diode D2 connected in parallel to the operational amplifier 132 and to the first diode D1. The second diode D2 may have a polarity opposite to that of the first diode D1. Each of the first and second diodes D1 and D2 may include a PN junction. Forward voltages of the first diode D1 and the second diode D2 may be identical. Thus, an electrical signal equal to or greater than a first reference value, from among electrical signals, may be output as a saturation signal, and an electrical signal less than the first reference value may be output as a variable signal. Forward voltages of the first diode D1 and the second diode D2 may be identical, but the present disclosure is not limited thereto. Forward voltages of the first diode D1 and the second diode D2 may be different from each other. The saturation circuits 130 and 130a of FIGS. 2 and 9 are each shown as including a resistor R, but are not limited thereto. The resistor R may be omitted from the saturation circuits 130 and 130a.

Figure 10:
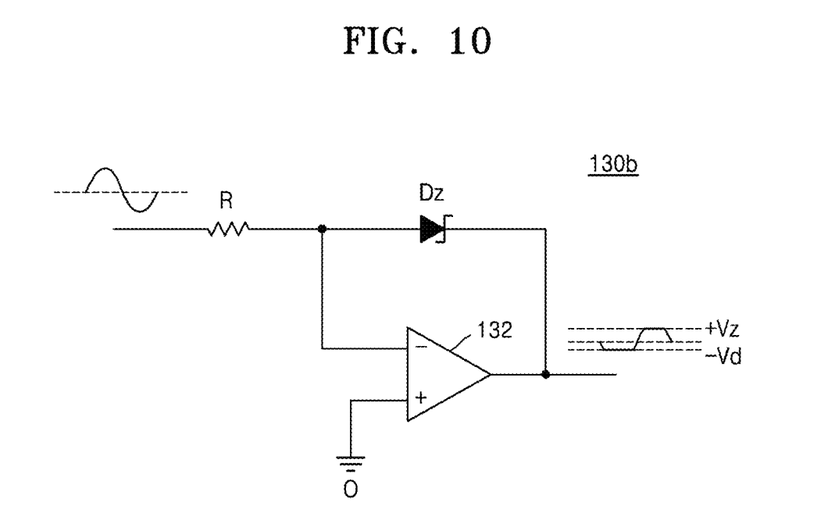
FIG. 10 is a view of a saturation circuit according to exemplary example embodiment.

FIG. 10 is a view of a saturation circuit 130b according to another exemplary embodiment. Referring to FIGS. 2 and 10, the saturation circuit 130b of FIG. 10 may include a Zener diode Dz. The Zener diode Dz may be used to output a plurality of saturation signals. For example, if the electrical signal input to the saturation circuit 130b is equal to or greater than the first reference value, the saturation circuit 130b may output a first saturation signal of constant magnitude by a forward voltage drop regardless of magnitude of the input electrical signal. The first reference value may be a forward voltage of the Zener diode Dz. An absolute value of the first saturation signal may be the same as the forward voltage of the Zener diode Dz, and the codes may be opposite to each other. If the input electrical signal is equal to or less than a second reference value, the saturation circuit 130b may output a second saturation signal of constant magnitude by a Zener breakdown phenomenon regardless of magnitude of the input electrical signal. The second reference value may be a Zener voltage of the Zener diode Dz. An absolute value of the second saturation signal may be the same as the Zener voltage of the Zener diode Dz, and the codes may be opposite to each other.

Also, if the input electrical signal is between the first reference value and the second reference value, the saturation circuit 130b may output a variable signal whose magnitude varies according to magnitude of the input electrical signal.

Figure 11:
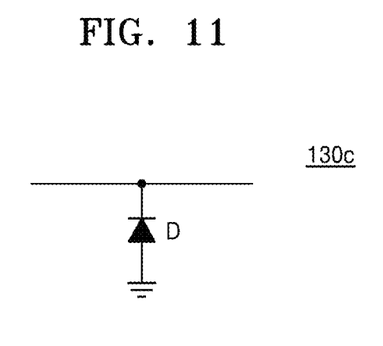
FIG. 11 is a view of a saturation circuit according to another exemplary embodiment.
Figure 12:
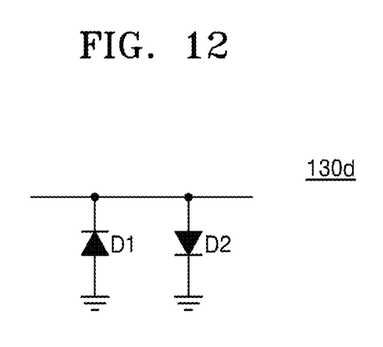
FIG. 12 is a view of a saturation circuit according to another exemplary embodiment.

FIGS. 11 and 12 are views of saturation circuits 130c and 130d according to other exemplary embodiments. As shown in FIG. 11, the saturation circuit 130c may include only one diode D and an operational amplifier may be omitted. For example, the saturation circuit 130c of FIG. 11 may be connected at one end to the optical receiver 120 and to the peak detector 140, and may include a grounded diode D at the other end. Alternatively, the saturation circuit 130d of FIG. 12 may be connected at one end to the optical receiver 120 and to the peak detector 140, and may include grounded first and second diodes D1 and D2 at the other end. The first and second diodes D1 and D2 may have opposite polarities connected to each other. Thus, the saturation circuit 130c of FIG. 11 outputs one saturation signal, whereas the saturation circuit 130d of FIG. 12 may output two saturation signals.

Since the distance-measuring device 100a according to an exemplary embodiment outputs a signal that satisfies a predetermined condition, from among electrical signals output from the optical receiver 120, as a saturation signal of constant magnitude, the deviation of signals input into the peak detector 140 can be decreased and a detection speed of the peak detector 140 can me increased, and thus, detection errors may be reduced. A resolution may be improved by reducing a detection error when measuring a distance of an object.

As described above, exemplary embodiments have been mainly described. Descriptions of features or aspects within each exemplary embodiment should typically be considered as available for other similar features or aspects in other exemplary embodiments. It should be understood that exemplary embodiments described herein should be considered in a descriptive sense only and not for purposes of limitation. While one or more exemplary embodiments have been described with reference to the figures, it will be understood by those of ordinary skill in the art that various changes in form and details may be made therein without departing from the spirit and scope as defined by the following claims.

What is claimed is:

1. A distance-measuring device comprising:
   an optical receiver configured to detect light reflected by an object and to convert the light into a plurality of electrical signals;
   a saturation circuit configured to receive the plurality of electrical signals and to output a saturation signal which is an electrical signal equal to or greater than a reference value, from among the plurality of electrical signals;
   a peak detector configured to detect a peak using the saturation signal output from the saturation circuit; and
   a processor configured to measure a distance to the object using the peak,
   wherein the saturation circuit is further configured to:
   output, as the saturation signal, a variable signal whose magnitude varies according to magnitudes of the plurality of electrical signals, when the plurality of electrical signals are less than the reference value, and
   output, as the saturation signal, a signal of a constant magnitude, when the plurality of electrical signals are equal to or greater than the reference value.

2. The distance-measuring device of claim 1, wherein the saturation circuit comprises:
   an operational amplifier; and
   at least one diode connected in parallel to the operational amplifier.

3. The distance-measuring device of claim 2, wherein an inverted input terminal of the operational amplifier is connected to a first end of the diode, and an output terminal of the operational amplifier is connected to a second end of the diode.

4. The distance-measuring device of claim 3, wherein the saturation circuit further comprises:
   a resistor, wherein a first end of the resistor is connected to the optical receiver and a second end of the resistor is connected to the inverted input terminal of the operational amplifier and to the first end of the diode.

5. The distance-measuring device of claim 4, further comprising:
   a capacitor disposed between the optical receiver and the saturation circuit and connected in series with the resistor.

6. The distance-measuring device of claim 2, wherein the reference value is equal to magnitude of a forward voltage of the diode.

7. The distance-measuring device of claim 2, wherein the diode comprises a Zener diode.

8. The distance-measuring device of claim 7, wherein the saturation signal comprises a first saturation signal and a second saturation signal, and wherein:
   the saturation circuit is configured to output, as the first saturation signal, an electrical signal equal to or greater than a first reference value from among the plurality of electrical signals, and
   the saturation circuit is configured to output, as the second saturation signal, an electrical signal less than a second reference value from among the plurality of electrical signals.

9. The distance-measuring device of claim 8, wherein the first reference value is a forward voltage of the Zener diode, and
   the second reference value is a Zener voltage of the Zener diode.

10. The distance-measuring device of claim 2, wherein the at least one diode comprises:
    a first diode connected in parallel to the operational amplifier; and
    a second diode connected in parallel to the operational amplifier and to the first diode, wherein a polarity of the second diode is opposite a polarity of the first diode.

11. The distance-measuring device of claim 1, wherein a magnitude of the saturation signal is equal to a magnitude of the reference value.

12. The distance-measuring device of claim 1, wherein a magnitude of the reference value is 1 V or less.

13. The distance-measuring device of claim 1, wherein the optical receiver comprises:
    a photodetector configured to output a current corresponding to the received light; and
    a current-to-voltage converter configured to convert the current into a voltage and output the voltage as the plurality of electrical signals.

14. The distance-measuring device of claim 13, wherein the photodetector comprises:
    at least one of a Single-Photon Avalanche Diode (SPAD) and an Avalanche Photodiode (APD).

15. The distance-measuring device of claim 1, wherein the peak detector is configured to detect the peak according to a Constant Fraction Discriminator (CFD) method.

16. The distance-measuring device of claim 1, wherein the peak detector further comprises:
    a comparator configured to compare an input signal with a reference value and output the input signal as a pulse signal.

17. The distance-measuring device of claim 1, further comprising:
    a light source configured to irradiate the object with a laser pulse.

18. A method of measuring a distance, the method comprising:
- detecting light reflected by an object and converting the light into a plurality of electrical signals;
- outputting a saturation signal which is an electrical signal equal to or greater than a reference value, from among the plurality of electrical signals;
- detecting a peak using the saturation signal; and
- measuring a distance to the object using the peak,
- wherein the outputting the saturation signal comprises:
  - outputting, as the saturation signal, a variable signal whose magnitude varies according to magnitudes of the plurality of electrical signals, when the plurality of electrical signals are less than the reference value, and
  - outputting, as the saturation signal, a signal of a constant magnitude when the plurality of electrical signals are equal to or greater than the reference value.

19. A method of measuring a distance to an object, the method comprising:
- irradiating light onto the object;
- detecting light reflected from the object and converting the detected light into a plurality of electrical signals;
- outputting a saturation signal having a constant magnitude, when the plurality of electrical signals are greater than or equal to a reference value and outputting a saturation signal having a variable magnitude when the plurality of electrical signals are greater than the reference value;
- detecting a peak of the saturation signal; and
- determining the distance to the object based on the peak.

* * * * *